(12) United States Patent
Miura et al.

(10) Patent No.: US 7,361,952 B2
(45) Date of Patent: Apr. 22, 2008

(54) SEMICONDUCTOR APPARATUS AND METHOD OF MANUFACTURING THE SAME

(75) Inventors: Yoshinao Miura, Kanagawa (JP); Kinya Ohtani, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 192 days.

(21) Appl. No.: 11/272,977

(22) Filed: Nov. 15, 2005

(65) Prior Publication Data

US 2006/0102953 A1 May 18, 2006

(30) Foreign Application Priority Data

Nov. 17, 2004 (JP) .............................. 2004-333531

(51) Int. Cl.
*H01L 29/76* (2006.01)
(52) U.S. Cl. ..................... 257/330; 257/332; 257/341; 257/342; 257/401
(58) Field of Classification Search ................ 257/330, 257/331, 332, 341, 342
See application file for complete search history.

(56) References Cited

U.S. PATENT DOCUMENTS 6,168,996 B1 * 1/2001 Numazawa et al. ........ 438/270
6,445,036 B1 9/2002 Maruoka
7,126,187 B2 * 10/2006 Aoki et al. ................. 257/330
2004/0036121 A1 2/2004 Aoki et al.

FOREIGN PATENT DOCUMENTS

| JP | 9-213951 | 8/1997 |
| JP | 10-270689 | 10/1998 |
| JP | 2001-060688 A | 3/2001 |
| JP | 2004-055976 A | 2/2004 |
| JP | 2004-079955 A | 3/2004 |

* cited by examiner

*Primary Examiner*—Zandra V. Smith
*Assistant Examiner*—Paul E Patton
(74) *Attorney, Agent, or Firm*—Foley & Lardner LLP

(57) ABSTRACT

A semiconductor apparatus includes a semiconductor substrate of a first conductivity type, a base region of a second conductivity type formed on a principal surface of the semiconductor substrate, a trench formed in a periphery of the base region, and an endless source region of the first conductivity type formed on a surface of the base region along the trench. In this semiconductor apparatus, the principal planes on side surfaces of the trench are composed of planes [100] and [110]. The interior angle of intersection of adjacent side surfaces of the trench is 135°. A minimum distance between the base region and the plane [110] facing each other through the source region is shorter than a minimum distance between the base region and the plane [100] facing each other through the source region.

19 Claims, 7 Drawing Sheets

SEMICONDUCTOR APPARATUS AND METHOD OF MANUFACTURING THE SAME

BACKGROUND OF THE INVENTION

1. Field of the Invention

The present invention is related to a semiconductor apparatus having a trench structure and a method of manufacturing the same.

2. Description of Related Art

A power metal-oxide semiconductor field-effect transistor (MOSFET) is a typical semiconductor apparatus that has both a high withstand voltage and a large current capacity. There are two types of power MOSFET: lateral power MOSFET and vertical power MOSFET. The lateral power MOSFET is designed so that operating current (drain current) flows horizontally through a semiconductor substrate. The vertical power MOSFET is designed so that drain current flows vertically through a semiconductor substrate. The vertical power MOSFET has become common since it is superior to the lateral power MOSFET in being easy to realize a high density unit cell structure and thus allowing an increase in on-current. Particularly distinguished is a vertical power MOSFET having a trench structure where a channel is perpendicular to a substrate, which is described in Japanese Unexamined Patent Publication No. 2001-60688, 10-270689, 09-213951, 2004-79955 and 2004-55976, for example.

FIG. 8 is a plan view showing the structure of the main part of a vertical power MOSFET having a trench structure according to a first conventional example. FIG. 9A is a sectional view along line IXA-IXA in FIG. 8, and FIG. 9B is a sectional view along line IXB-IXB in FIG. 8. As shown in FIGS. 8, 9A and 9B, the vertical power MOSFET 400 includes a semiconductor substrate 101, a drift region 102, a base region 103, a source region 104, a trench 105, a gate oxide film 106, a gate electrode 107, a unit cell 108, an interlayer insulating film 110, a contact hole 111, a source electrode 112, and a drain electrode 113.

In the vertical power MOSFET 400 of the first conventional example, on an n+ type semiconductor substrate (high impurity concentration semiconductor substrate) 101, the drift region 102 composed of an n− type semiconductor layer (low impurity concentration semiconductor layer) that is an epitaxial layer having a lower impurity concentration than the semiconductor substrate 101 is formed. Further, p-type impurity is ion-implanted into the n− semiconductor layer to form the p-type base region 103. On the periphery of the p-type base region 103 is formed the trench 105 with a depth that reaches down to the drift region 102. The trench structure of the first conventional example is a typical structure that is used most frequently.

The gate oxide film 106 is formed on the inner surface of the trench 105. The gate electrode 107 made of polysilicon or the like is formed on the gate oxide film 106 so as to fill the trench 105. Further, n-type impurity is ion-implanted into the surface of the p-type base region 103 to form the endless n+ type source region 104 along the trench 105. The trench 105 has a rectangular shape as shown in FIG. 8. A trench gate is formed along a plane direction equivalent to a plane (100) on the Si (001) substrate surface, which is referred to herein as the plane [100].

Above the p-type base region 103, the n+ type source region 104, the gate oxide film 106 and the gate electrode 107 are the interlayer insulating film 110 and the source electrode 112 which are laminated in this order. The interlayer insulating film 110 has the contact hole 111, through which the source electrode 112 is electrically connected to the p-type base region 103 and the n+ type source region 104. The drain electrode 113 is formed on the backside of the semiconductor substrate 101 which is opposite from the principal surface where the trench 105 is formed.

In the vertical power MOSFET having such a structure, a pn junction that is created in the interface between the drift region 102 and the base region 103 is depleted of charge carriers due to reverse bias during Off-state. During On-state, on the other hand, a FET inversion layer is formed on the side surface of the trench 105, and thereby a current flows from the drain electrode 113 to the source electrode 112 as indicated by the arrow c in FIG. 9B. It is preferred to design the vertical power MOSFET so that On-state current is as high as possible with respect to Off-state withstand voltage.

Since the vertical power MOSFET is used in connection with an inductor, reverse withstand voltage is applied between the drain and source during switch-off, and current flow beyond a certain design limit can result in breakdown of devices. A degree to tolerate breakdown current is called device breakdown tolerance, and a device is preferably designed to have high breakdown tolerance.

It is important for the vertical power MOSFET to prevent device breakdown. The device breakdown of the vertical power MOSFET is caused by the operation of NPN bipolar transistor, which is referred to herein as the parasitic bipolar transistor, where source, base and drain serve as emitter, base and collector, respectively. Specifically, if part of dielectric current flows into the base as shown by a current path d that is indicated by the arrow in FIG. 9B and a base voltage increases, the parasitic bipolar transistor turns on to apply positive feedback during a temperature increase and a current increase, which eventually causes device breakdown.

In the first conventional example described above, current is likely to concentrate at a cell corner of a rectangular trench. Breakdown thereby tends to occur at the cell corner and its vicinity, which can cause the parasitic bipolar transistor to turn on.

Japanese Unexamined Patent Publication No. 2001-60688 mentioned above, which is referred to herein as a second conventional example, proposes a structure to prevent a decrease in device breakdown tolerance. FIG. 10 is a plan view showing the structure of a main part of a vertical power MOSFET 500 having a trench structure according to the second conventional example. FIG. 11A is a sectional view along line XIA-XIA in FIG. 10, and FIG. 11B is a sectional view along line XIB-XIB in FIG. 10. In the following description, the same elements as in the vertical power MOSFET 400 of the first conventional example are denoted by the same reference symbols and not detailed herein.

The vertical power MOSFET 500 of the second conventional example has a narrow source region 116 that is formed diagonally from a contact part of a unit cell where an electric field concentrates to the corners of the cell. Due to the presence of the narrow source region 116, the length of a source part ($L_5$ in FIG. 11B) along the diagonal of a cell is shorter than that ($L_4$ in FIG. 9B) of the first conventional example. In this structure, the distance of a current path e (see FIG. 11B) from the drain electrode to the source electrode is shorter than the distance of a current path d (see FIG. 9B). This reduces the part where the current path e passes through the base, thereby lowering resistance in the base part. It is therefore possible to reduce an increase in base voltage that occurs when part of dielectric current flows into the base, which hinders the activation of the parasitic bipolar transistor. This allows suppressing a decrease in device breakdown tolerance.

Japanese Unexamined Patent Publication No. 10-270689 describes a technique that forms a side surface of a trench with the plane [100] and [110] so as to improve the uniformity of a gate insulating film and increase gate withstand voltage. Japanese Unexamined Patent Publication No. 09-213951 describes a technique that makes the plane shape of a side surface of a trench octagon and quadrangle and forms their side surfaces with the plane [100] and [110]. Further, Japanese Unexamined Patent Publication No. 09-213951 and 2004-79955 propose the structure that uses the plane [100] and [110] with high mobility for a trench side surface and preferably makes the plane [100] larger than the plane [110], thereby reducing on-resistance.

As electronic equipment achieve small-size, light-weight, high-speed operation and high-frequency performance, the need increases for higher density integration of a semiconductor device to be mounted on the electronic equipment. It is thus strongly required for vertical power MOSFET to further reduce the cell size while preventing a decrease in device breakdown tolerance.

However, the semiconductor apparatus according to Japanese Unexamined Patent Publication No. 2001-60688 is unfavorable for the further reduction of cell size since it needs to place the narrow source region 116. The semiconductor apparatus according to Japanese Unexamined Patent Publication No. 09-213951 is also unfavorable for the further reduction of cell size since the trench is composed of a combination of octagon and quadrangle shapes. Further, the mere enlargement of the plane [100] with respect to the plane [110] that is proposed by Japanese Unexamined Patent Publication No. 09-213951 and 2004-79955 can result in easy activation of a parasitic bipolar transistor due to an increase in base voltage.

SUMMARY OF THE INVENTION

According to an embodiment of the invention, there is provided a semiconductor apparatus that includes a semiconductor substrate of a first conductivity type, a base region of a second conductivity type formed on a principal surface of the semiconductor substrate, a trench has a substantially octagonal plane shape and formed in a periphery of the base region, and an endless source region of the first conductivity type formed on a surface of the base region along the trench. In this semiconductor apparatus, the principal planes on side surfaces of the trench are composed of planes [100] and [110]. A minimum distance between the base region and the plane [110] facing each other through the source region is shorter than a minimum distance between the base region and the plane [100] facing each other through the source region.

With this configuration, the present invention can prevent a decrease in device breakdown tolerance while achieving reduction of cell size. This is because of the following reasons.

Since the present invention forms the principal plane directions of the trench side surfaces with [100] and [110] and the trench has a substantially octagonal plane shape, it is possible to ease the concentration of current at a channel along a cell corner compared with a rectangular cell.

Further, since the minimum distance between the base region and the trench side surface composed of the plane [110] that face each other through the source region is shorter than the minimum distance between the base region and the trench side surface composed of the plane [100] that face each other through the source region, it is possible to reduce the distance that current passes through the base region as a whole in a unit cell compared with the case where the trench side surface is composed of only the plane [100] even when part of dielectric current flows into the base. This allows suppression of an increase in base voltage even if part of dielectric current flows into the base. As a result, this structure hinders the activation of a parasitic bipolar transistor, thus preventing a decrease in device breakdown tolerance.

Furthermore, since the trench of this embodiment has a simple structure where the principal plane direction of the trench side surface is formed with [100] and [110], and the trench has a substantially octagonal plane shape, it is possible to achieve reduction in cell size.

As described above, the present invention has a beneficial effect that provides a semiconductor apparatus capable of preventing a decrease in device breakdown tolerance and achieving reduction in cell size.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Figure 1:
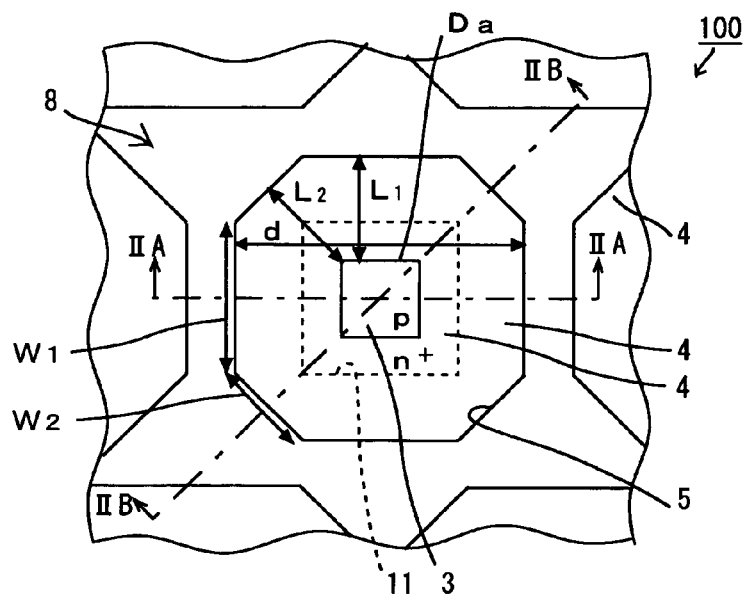
FIG. 1 is a plan view showing the configuration of the main part of a semiconductor apparatus according to an embodiment of the invention.
Figure 2A:
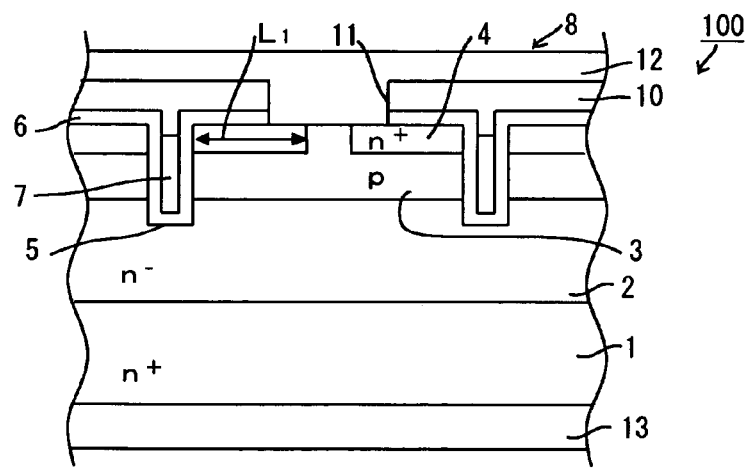
FIG. 2A is a sectional view along line IIA-IIA of FIG. 1.
Figure 2B:
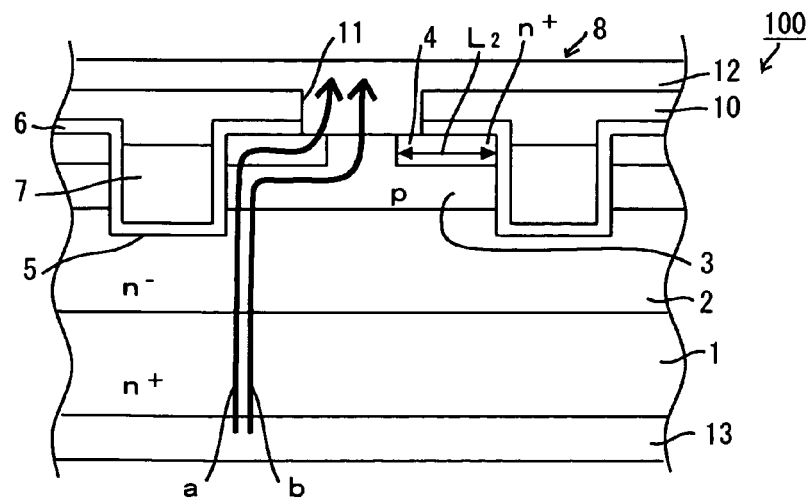
FIG. 2B is a sectional view along line IIB-IIB of FIG. 1.

FIG. 1 is a plan view showing the configuration of the main part of a vertical power MOSFET having a trench structure according to this embodiment. FIG. 2A is a sectional view along line IIA-IIA of FIG. 1, and FIG. 2B is a sectional view along line IIB-IIB of FIG. 1. As shown in FIGS. 1, 2A and 2B, the vertical power MOSFET 100 includes a semiconductor substrate 1, a drift region 2, a base region 3, a source region 4, a trench 5, a gate oxide film 6, a gate electrode 7, a unit cell 8, an interlayer insulating film 10, a contact hole 11, a source electrode 12, and a drain electrode 13. In FIG. 1, the gate oxide film 6, the gate electrode 7, the interlayer insulating 10 and the source electrode 12 are not illustrated for the sake of convenience in description. A position to create the contact hole 11 is illustrated in dotted line.

The semiconductor substrate 1 is a silicon substrate and it is an n+ type semiconductor substrate (high impurity concentration semiconductor substrate), for example. On the semiconductor substrate 1 is formed the drift region 2 composed of an n− type semiconductor layer (low impurity concentration semiconductor layer) that is an epitaxial layer having a lower impurity concentration than the semiconductor substrate 1. Further, p-type impurity is ion-implanted into the n− semiconductor layer to form the p-type base region 3.

On the periphery of the p-type base region 3 is formed the trench 5 with a depth that reaches down to the drift region 2. The gate oxide film 6 is formed on the inner surface of the trench 5, and the gate electrode 7 made of polysilicon or the like is formed on the gate oxide film 6 so as to fill the trench 5. Further, n-type impurity is ion-implanted into the surface of the p-type base region 3 to form the endless n+ type source region 4 along the trench 5.

The interlayer insulating film 10 and the source electrode 12 are laminated in this order above the base region 3, the source region 4, the gate oxide film 6 and the gate electrode 7 as shown in FIGS. 2A and 2B. The interlayer insulating film 10 has the contact hole 11, through which the source electrode 12 is electrically connected to the p-type base region 3 and the n+ type source region 4. The drain electrode 13 is formed on the backside of the semiconductor substrate 1 which is opposite from the surface where the trench 5 is formed.

The vertical power MOSFET 100 having the trench structure of this embodiment includes a plurality of (for example, several hundreds of thousands of) unit cells with trench structure. In the vertical power MOSFET 100, a pn junction that is created in the interface between the drift region 2 and the base region 3 is depleted of charge carriers due to reverse bias during Off-state. During On-state, on the other hand, a FET inversion layer is formed on the side surface of the trench 5, and thereby current flows from the drain electrode 13 to the source electrode 12 as indicated by a current path a in FIG. 1.

The configuration of a unit cell of the vertical power MOSFET 100 according to this embodiment is described in detail below.

As shown in FIG. 1, in the trench 5 of the vertical power MOSFET 100 of this embodiment, the interior angle of the intersection of adjacent side surfaces is 135°. The plane shape of the trench 5 formed on the Si (001) substrate is an octagon. The plane directions equivalent to the planes (100) and (110) on the Si (001) substrate are referred to herein as [100] and [110], respectively.

The principal plane direction of the side surface of the trench 5 is composed of [100] and [110]. A minimum distance $L_2$ between the base region 3 and the plane [110] of the side surface of the trench 5 is designed to be shorter than a minimum distance $L_1$ between the base region 3 and the plane [100] of the side surface of the trench 5 as represented by the following expression:

$$L_1 > L_2 \qquad \text{Expression 1}$$

Setting the interior angle of the intersection of adjacent side surfaces of the trench 5 to substantially 135° allows easing the concentration of current at a channel along the cell corner compared with a rectangular cell. Further, since the minimum distance $L_2$ between the base region 3 and the trench side surface composed of the plane [110] that face each other through the source region 4 is shorter than the minimum distance $L_1$ between the base region 3 and the trench side surface composed of the plane [100] that face each other through the source region 4, it allows the distance that current passes through the base region 3 as a whole in a unit cell when part of dielectric current flows into the base region 3 to be shorter than that in the case where the trench side surface is composed of only the plane [100]. This lowers entire base resistance, thereby suppressing an increase in base voltage even when part of dielectric current flows into the base region 3.

The activation of a parasitic bipolar transistor is thereby hindered, thus preventing a decrease in device breakdown tolerance. It is therefore possible to provide a reliable semiconductor apparatus.

Further, this embodiment allows reduction in cell size since the structure is as simple as forming the principal planes of the trench with [100] and [110] and setting the interior angle of the trench to 135°.

The semiconductor apparatus of this embodiment is configured so as to satisfy the following expression where the length of the side (first side) of the plane [100] of the side surface (first side surface) of the trench 5 in the horizontal direction of the semiconductor substrate 1 is W1 and the length of the side (second side) of the plane [110] of the side surface (second side surface) of the trench 5 is W2:

$$W1 > W2 \qquad \text{Expression 2}$$

W1 and W2 are symbols that represent both each side itself and the length of each side.

By satisfying Expression 2, it is possible to increase the mobility of electrons in a channel region to improve the performance of power MOSFET. Further, in the conditions of Expression 2, current density is higher in the vicinity of the plane [110] having W2 than in the vicinity of the plane [100] having W1. However, since base resistance is lowered in the vicinity of the plane [110] by reducing the length of the source region ($L_2$) to shorten a distance that dielectric current passes through the base, an increase in base voltage is suppressed even when part of dielectric current flows through the current path b. It is thereby possible to reduce an increase in base voltage so as to hinder the activation of a parasitic bipolar transistor, thus preventing a decrease in device breakdown tolerance.

The plane shape of the base region 3 of this embodiment is substantially square as shown in FIG. 1. The side surfaces of the base region 3 are composed of four surfaces that are parallel with the side surface planes [100] of the trench 5. A side of a substantial square that forms the plane shape of the base region 3 is indicated by Da. A minimum distance between the plane [100] of the side surface of the trench 5 and the plane [100] of the opposite side surface of the trench 5 is indicated by d. Da is a symbol that represents both a side itself and the length of the side. $L_1$ and $L_2$ are given by Expressions 3 and 4 below. W1 and W2 satisfy the relationship represented by Expression 5.

$$L_1 = \frac{(d - D_a)}{2} \quad \text{Expression 3}$$

$$L_2 = \frac{\sqrt{2}(d - D_a)}{2} - \frac{W2}{2} \quad \text{Expression 4}$$

$$W1 = d - \sqrt{2} \cdot W2 \quad \text{Expression 5}$$

In this embodiment, an intersection of perpendicular bisectors of Da adjacent to each other in the base region substantially corresponds to an intersection of perpendicular bisectors of two sides W1 adjacent to each other through W2. In this case, substitution of Expressions 3 and 4 into Expression 1 gives the following expressions:

$$W2 > (\sqrt{2} - 1) \cdot (d - D_a) \approx 0.41 \cdot (d - D_a) \quad \text{Expression 6}$$

$$W1 < (\sqrt{2} - 1) \cdot d + (2 - \sqrt{2}) \cdot D_a \approx 0.41d + 0.59 D_a \quad \text{Expression 7}$$

Figure 3:
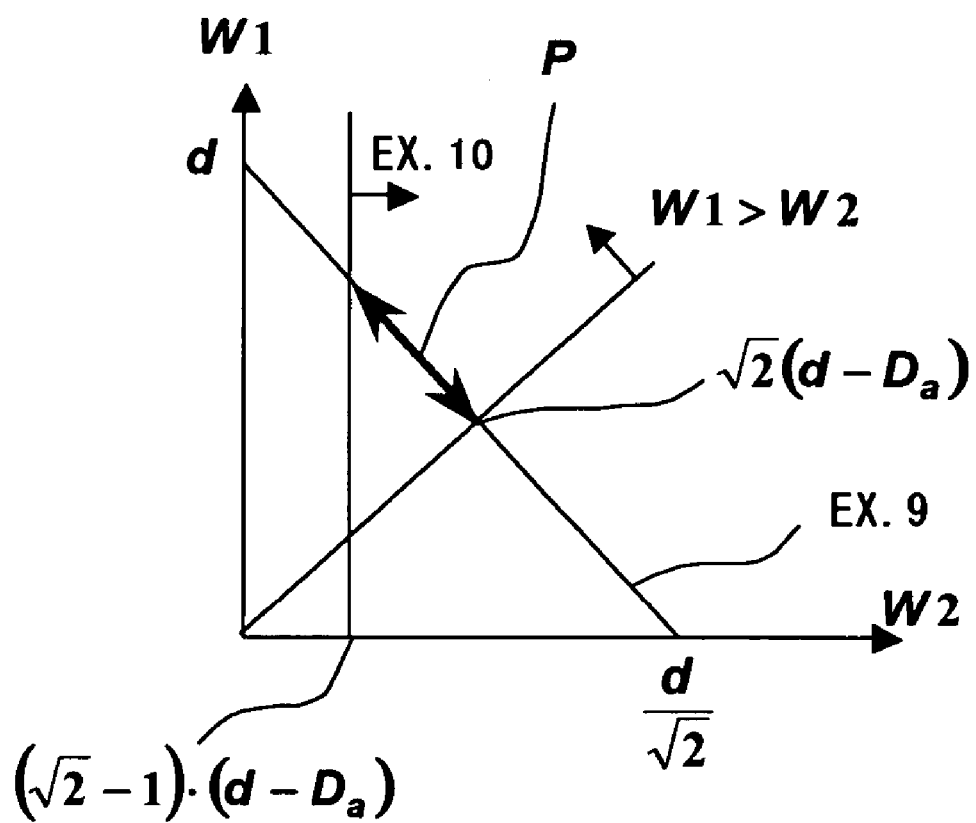
FIG. 3 is an explanatory view showing a preferred range of W2 according to an embodiment of the invention.

FIG. 3 is a graph showing the relationship of Expressions 2, 5 and 6. The horizontal axis indicates W2 and the vertical axis indicates W1, and the region of the dual directional arrow P is a preferred range of W2. Since W1 is preferably as large as possible as described earlier, it is preferred in the region of the dual directional arrow P that W2 is as small as possible, that is, W1 is as large as possible.

By setting the value of W1 as large as possible in the range that satisfies Expression 1, it is possible to prevent a decrease in device breakdown tolerance and improve the reliability while improving the performance of power MOSFET. Setting a large value to W1 allows increasing the mobility of electrons in a channel region, thereby improving the performance of power MOSFET. Further, in the conditions of Expression 2, current density is higher in the vicinity of the plane [110] with W2 than in the vicinity of the plane [100] with W1. However, satisfying Expressions 3 and 4 allows lowering base resistance even when part of dielectric current flows through the current path b shown in FIG. 2B, thereby suppressing an increase in base voltage. It is therefore possible to reduce an increase in base voltage so as to hinder the activation of a parasitic bipolar transistor, thus preventing a decrease in device breakdown tolerance.

In this embodiment, the setting conditions of the length of W1 in the plane [100] may be the following Expression 8 instead of Expression 7 mentioned above.

$$W1' = W1 + \sqrt{2} \cdot (r-1) \cdot (d - D_a) \quad \text{Expression 8}$$

This is because of the following reasons. The gate oxide film 6 is formed by thermally oxidizing the surface of the trench 5 at a temperature of about 850° C., for example. In this case, the oxide film is thicker in the plane [110] than in the plane [100] due to plane direction dependency in oxidation speed. As a result that the oxide film of the plane [110] is thicker than the oxide film of the plane [100], the transconductance value in the plane [110] is smaller than the transconductance value in the plane [100].

If the oxide film thickness of the plane [100] is $t_1$, the oxide film thickness of the plane [110] is $t_2$, the transconductance value in the plane [100] is $g_{m1}$, and the transconductance value in the plane [110] is $g_{m2}$, a ratio r of transconductance between the plane [100] and the plane [110] is represented by the following expression:

$$r = \frac{g_{m1}}{g_{m2}} = \frac{t_2}{t_1} \quad \text{Expression 9}$$

A base voltage drop is proportional to base current and the length of the source region. Therefore, the conditions where a base voltage drop between a channel and a contact during breakdown does not reach its maximum at least when passing through the current path b is represented by the following expression:

$$g_{m1} \cdot L_1 > g_{m2} \cdot L_2 \quad \text{Expression 10}$$

Expression 8 can be derived from Expressions 9, 10, 3 and 4.

As obvious from Expression 8, the length of one side of the plane [100] may be larger than the value of W1 of Expression 7 in accordance with the ratio r (>1) of transconductance. This increases the mobility of electrons in a channel region more effectively, thereby improving the performance of power MOSFET.

A method of manufacturing a semiconductor apparatus according to this embodiment is described hereinafter with reference to FIGS. 4A to 4D, 5A and 5B. FIGS. 4A to 4D, 5A and 5B are all sectional views along line IIA-IIA in FIG. 1. The following manufacturing process is a typical example, and other manufacturing processes may be used as long they do not deviate from the gist of the present invention.

Figure 4A:
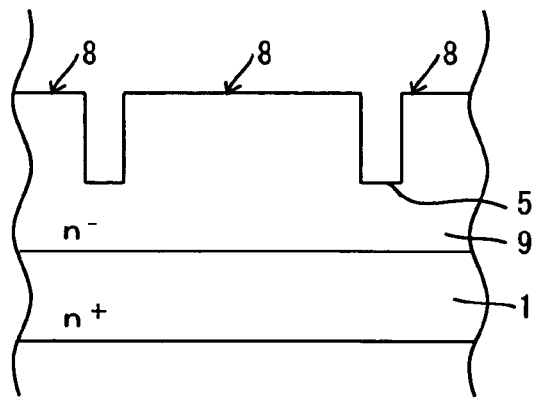
FIG. 4A is a process view showing a method of manufacturing a semiconductor apparatus according to an embodiment of the invention.

Referring first to FIG. 4A, on the semiconductor substrate 1 such as an n+ type semiconductor substrate made of silicon whose surface is a plane (100), the n− type semiconductor layer 9 that has a lower impurity concentration than the semiconductor substrate 1 is epitaxially grown. Then, the trench 5 of 1 to 2 µm is formed in the n− type semiconductor layer 9 (2) at the position to be the periphery of the p type base region 3, which is described later, by photolithography process. It is then segmented into a plurality of unit cells 8. The photolithography process uses a photoresist film which is patterned into a shape that cuts four corners of a square at 45°. This embodiment forms the trench whose principal planes are composed of [100] and [110] and whose plane shape is an octagon.

Figure 4B:
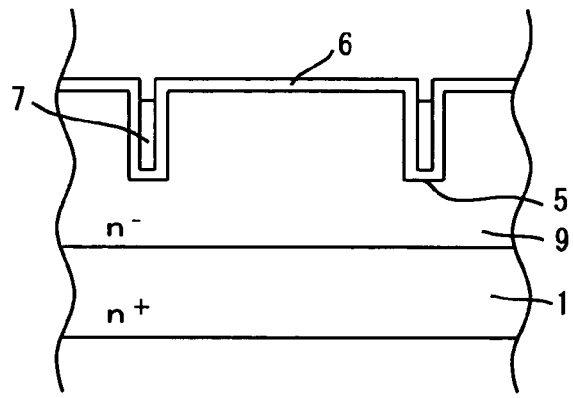
FIG. 4B is a process view showing a method of manufacturing a semiconductor apparatus according to an embodiment of the invention.

Referring next to FIG. 4B, the gate oxide film 6 is formed on the whole area including the trench 5 by thermal oxidation. A polysilicon film is then formed on the whole area by Chemical Vapor Deposition (CVD). After that, phosphorous diffusion and etch-back are performed successively so as to remove an unnecessary part of the polysilicon film so that it is left only inside the trench 5, thereby forming the gate electrode 7.

Figure 4C:
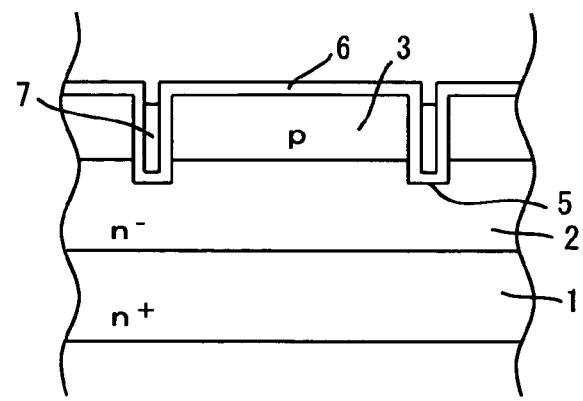
FIG. 4C is a process view showing a method of manufacturing a semiconductor apparatus according to an embodiment of the invention.

Referring then to FIG. 4C, the p type base region 3 with the depth of 1 to 2 µm is formed all over the n− type semiconductor layer 9 (2) that is surrounded by the trenches 5. For example, after ion implantation using boron B as p-type impurity, annealing is performed for 10 to 20 minutes at a temperature of 1100° C. to 1200° C.

Figure 4D:
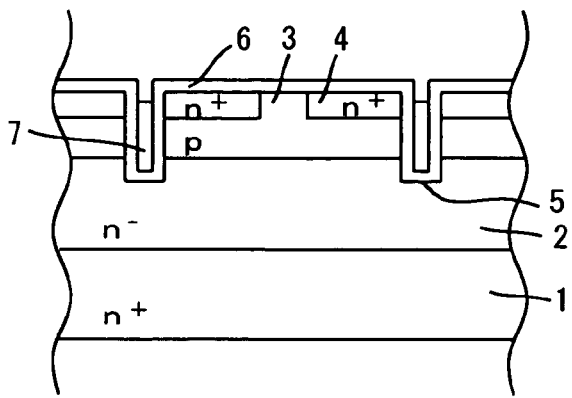
FIG. 4D is a process view showing a method of manufacturing a semiconductor apparatus according to an embodiment of the invention.

Referring then to FIG. 4D, the n+ source region 4 is formed. Specifically, ion implantation using arsenic (As) as n− type impurity is performed on the surface of the p type base region 3 in endless form along the trench by using a photoresist film which is patterned into the shape that corresponds to the base region as shown in FIGS. 2A and 2B as a mask. After that, annealing is performed for 25 to 35 minutes at a temperature of 980° C. to 1050° C., for example. The thickness of the n+ source region 4 is 0.4 to 0.8 μm, for example.

Figure 5A:
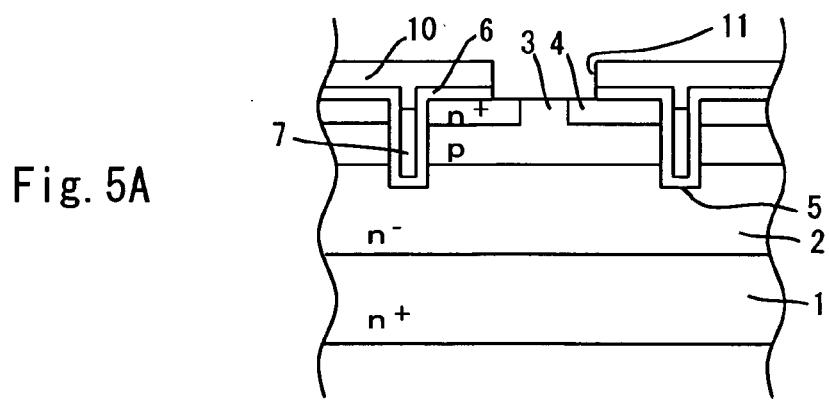
FIG. 5A is a process view showing a method of manufacturing a semiconductor apparatus according to an embodiment of the invention.
Figure 5B:
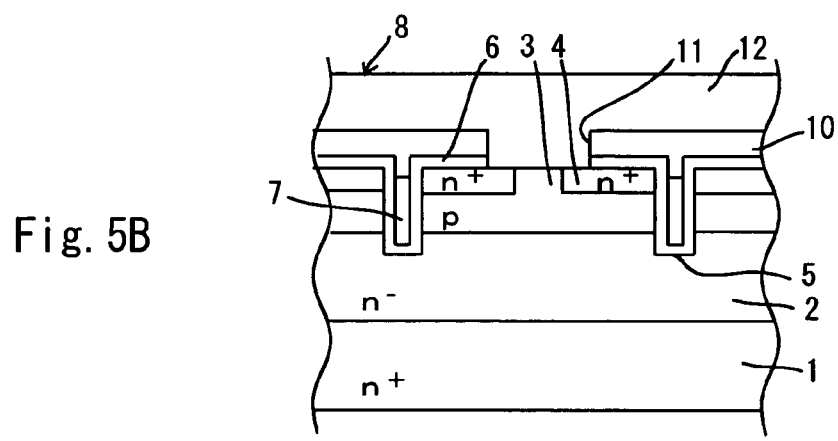
FIG. 5B is a process view showing a method of manufacturing a semiconductor apparatus according to an embodiment of the invention.

Referring then to FIG. 5A, the interlayer insulating film 10 is formed by CVD, and the gate oxide film 6 and the interlayer insulating film 10 are patterned to form the contact opening 11. Referring finally to FIG. 5B, the source electrode 12 is formed to fill the contact opening 11.

Since the manufacturing method of the semiconductor apparatus according to this embodiment uses a process that is as simple as forming the side surfaces of the trench with [100] and [110] and setting the interior angle of the intersection of adjacent trench side surfaces to 135°, it is possible to achieve reduction in cell size without substantially changing processing accuracy compared with a conventional structure.

Further, since this manufacturing method performs formation of the base region 3 and the source region 4 that requires high temperature processing after forming the trench 5, it is possible to form a trench structure with stable properties without thermally affecting the trench 5 and a semiconductor crystal in the vicinity of the trench 5.

Furthermore, since the minimum distance $L_2$ between the base region 3 and the trench side surface composed of the plane [110] that face each other through the source region 4 is shorter than the minimum distance $L_1$ between the base region 3 and the trench side surface composed of the plane [100] that face each other through the source region 4, it is possible to reduce the distance that current passes through the base region 3 as a whole in a unit cell when part of dielectric current flows into the base region 3. This lowers entire base resistance even if part of dielectric current flows into the base region 3, thereby suppressing an increase in base voltage. It is therefore possible to hinder the activation of a parasitic bipolar transistor, thus preventing a decrease in device breakdown tolerance.

Though the plane shape of the source region 4 is substantially square in the above embodiment, it is not limited thereto, and other shapes may be used as long as the minimum distance $L_2$ between the base region 3 and the trench side surface composed of the plane [110] that face each other through the source region 4 is shorter than the minimum distance $L_1$ between the base region 3 and the trench side surface composed of the plane [100] that face each other through the source region 4. Further, though the above embodiment describes a case where the lengths of the sides of the plane [100] of the semiconductor substrate 1 in the horizontal direction and the lengths of the sides of the plane [110] of the semiconductor substrate 1 in the horizontal direction are all the same, it is feasible to use a combination of the plane [100] and the plane [110] with different side lengths in a unit cell. It is also feasible that the plane shape of the trench is different in a different unit cell.

Alternative Embodiment 1

Figure 6:
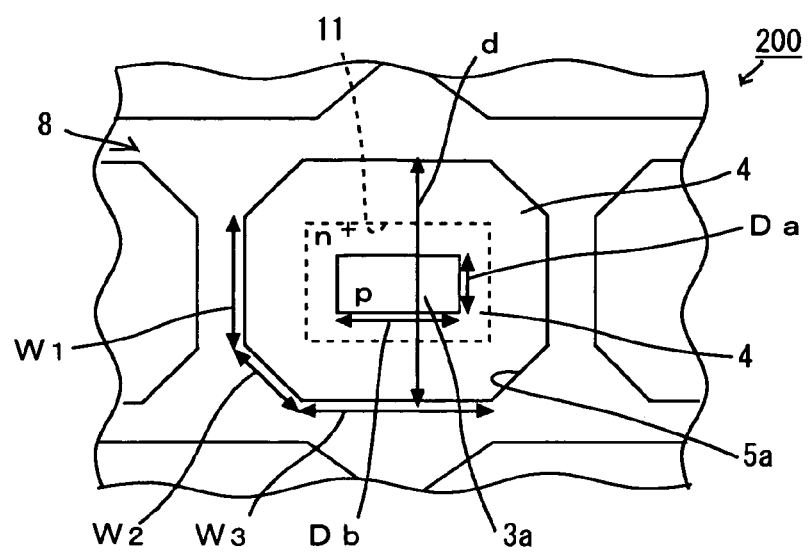
FIG. 6 is a plan view showing the configuration of the main part of a semiconductor apparatus according to an alternative embodiment 1.

An alternative embodiment having a trench structure that is different from the above embodiment is described hereinafter. FIG. 6 is a plan view showing the trench structure of the alternative embodiment 1. In the following description, the same elements as in the above embodiment are denoted by the same reference symbols and not detailed herein.

The semiconductor apparatus 200 of the alternative embodiment 1 has basically the same structure as the above embodiment except for the following points. Though the trench 5 of the above embodiment is an octagon having W1 and W2, a trench 5a of this alternative embodiment is an octagon having W1, W2 and W3 as shown in FIG. 6. Further, though the base region 3 of the above embodiment has a substantially square plane shape, a base region 3a of this alternative embodiment has a substantially rectangle plane shape.

Specifically, the sides of the plane [100] on the side surface of the trench 5a are indicated by W1 and W3 where W1<W3, and the length of the side (third side) of the plane [110] on the side surface of the trench 5a is indicated by W2. The side (fourth side) of the base region 3a that is parallel with W1 is indicated by Da and the side (fifth side) of the base region 3a that is parallel with W3 is indicated by Db.

In the case where the plane shape of the base region is substantially rectangular, values of W1 and W2 are determined firstly so as to optimize the shape of a substantially square base region whose one side has a length of Da that serves as a short side of the base region 3. Then, a value of W3 is determined so that an intersection of perpendicular bisectors of Da and Db that are adjacent to each other in the base region 3a substantially corresponds to an intersection of perpendicular bisectors of W1 and W3 that are adjacent to each other through W2, and a minimum distance from a mid point of W1 to the base region 3a and a minimum distance from a mid point of W3 to the base region 3a are substantially the same. In sum, the positions of the trench 5a and the base region 3a are determined so as to satisfy the following expressions:

| | |
|---|---|
| $D_b \geq D_a$, $W3 \geq W1$ | Expression 11 |
| $W1 > W2$ | Expression 12 |
| $W1 = d - \sqrt{2} \cdot W2$ | Expression 13 |
| $W2 > (\sqrt{2}-1) \cdot (d - D_a)$ | Expression 14 |
| $D_b - D_a = W3 - W1 \geq 0$ | Expression 15 |

It is desirable to satisfy Expressions 11 to 14. It is more desirable to replace Expression 11 with Expression 15 so as to satisfy Expressions 12 to 15. Satisfying Expressions 11 to 14 or 12 to 15 allows setting large values to W1 and W3 while setting the minimum distance $L_2$ between the base region 3a and the plane [110] of the side surface of the trench 5a to be shorter than the minimum distance $L_1$ between the base region 3a and the plane [100] of the side surface of the trench 5a in the case where the plane shape of the base region 3a is rectangular. It is therefore possible to increase the mobility of electrons in a channel region to improve the performance of the power MOSFET while preventing a decrease in device breakdown tolerance due to the same reasons as the above embodiment. It is also possible to achieve reduction in cell size as is the case with the above embodiment.

Alternative Embodiment 2

Figure 7:
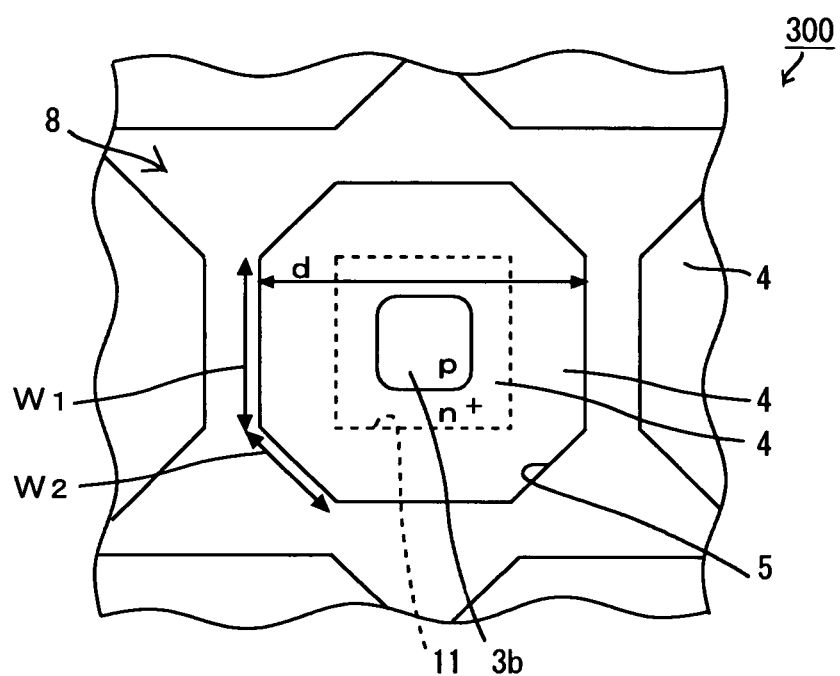
FIG. 7 is a plan view showing the configuration of the main part of a semiconductor apparatus according to an alternative embodiment 2.
Figure 8:
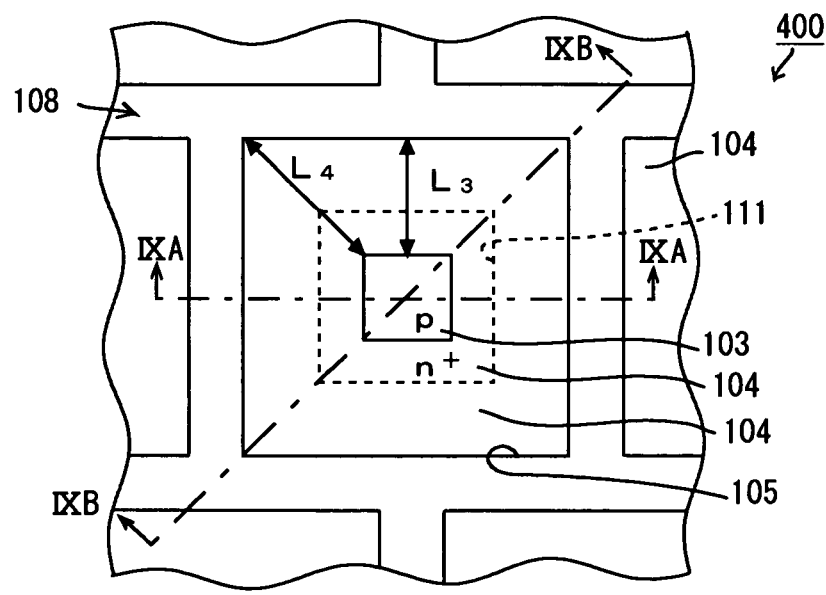
FIG. 8 is a plan view showing the configuration of the main part of a semiconductor apparatus according to a first conventional example.
Figure 9A:
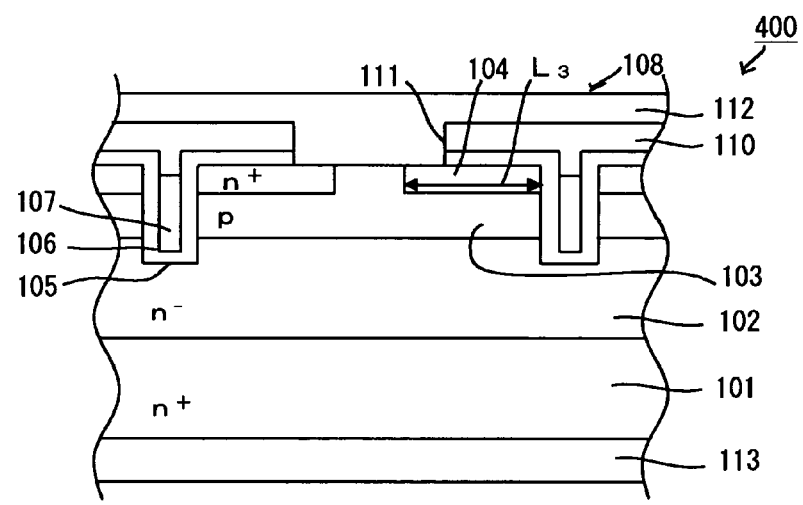
FIG. 9A is a sectional view along line IXA-IXA of FIG. 8.
Figure 9B:
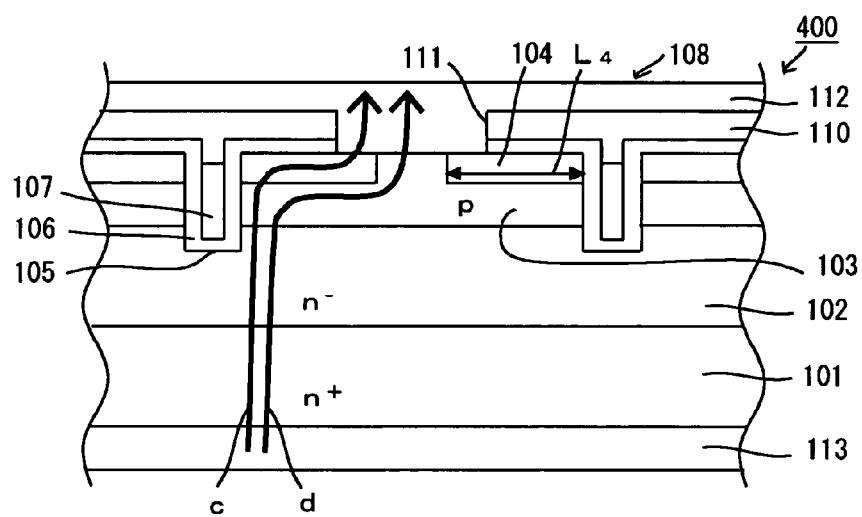
FIG. 9B is a sectional view along line IXB-IXB of FIG. 8.
Figure 10:
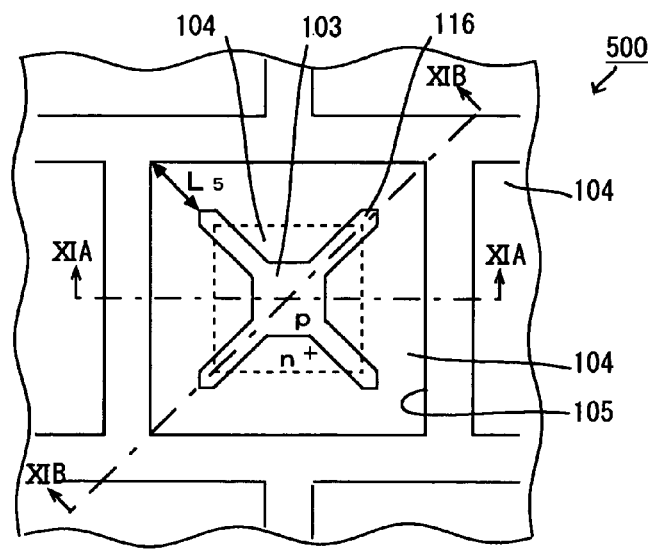
FIG. 10 is a plan view showing the configuration of the main part of a semiconductor apparatus according to a second conventional example.
Figure 11A:
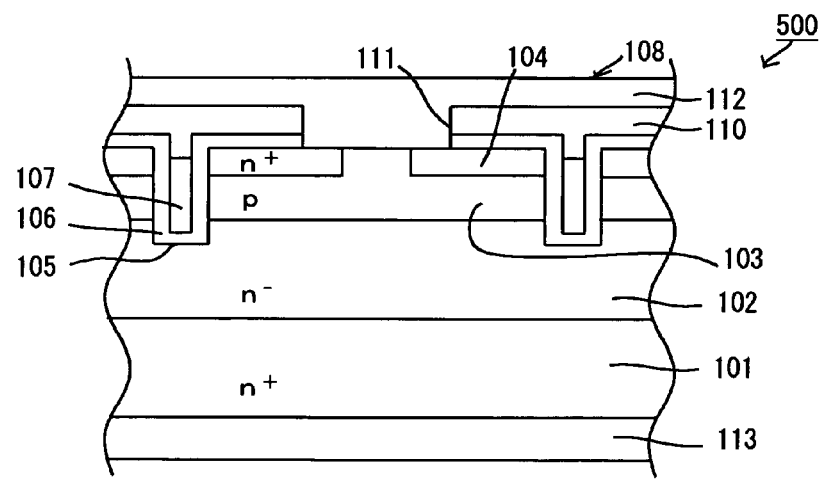
FIG. 11A is a sectional view along line XIA-XIA of FIG. 10.
Figure 11B:
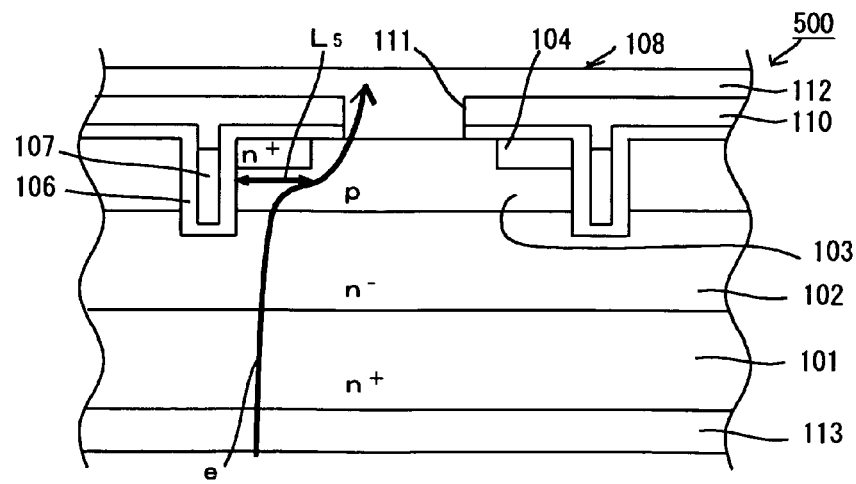
FIG. 11B is a sectional view along line XIB-XIB of FIG. 10.

An alternative embodiment having a trench structure that is different from the above embodiment is described hereinafter. FIG. 7 is a plan view showing the trench structure of the alternative embodiment 2.

The semiconductor apparatus 300 of the alternative embodiment 2 has basically the same structure as the above embodiment except for the following points. Though the internal angle of adjacent side surfaces of the base region 3 is 90° in the above embodiment, a corner between adjacent side surfaces of the base region 3b is rounded in this embodiment as shown in FIG. 7. In other words, the source region 4 includes an electrode connecting area that connects a source electrode. The electrode connecting area has four sides that are parallel with the plane [100] and corners that are rounded.

This structure allows easing the concentration of base current density at a base corner part. It is therefore possible to suppress a base voltage drop more effectively.

It is apparent that the present invention is not limited to the above embodiment that may be modified and changed without departing from the scope and spirit of the invention.

What is claimed is:

1. A semiconductor apparatus comprising:
   a semiconductor substrate of a first conductivity type;
   a base region of a second conductivity type formed on a principal surface of the semiconductor substrate;
   a trench having a substantially octagonal plane shape and formed in a periphery of the base region; and
   a source region of the first conductivity type formed on a surface of the base region along the trench, wherein
   principal planes on side surfaces of the trench are composed of: a first plane [100] that faces the base region through the source region and a second plane [110] that faces the base region through the source region, and
   a minimum distance ($L_2$) between the base region and the second plane [110] is shorter than a minimum distance ($L_1$) between the base region and the first plane [100].

2. The semiconductor apparatus according to claim 1, wherein a planar surface of the source region has a closed shape defined by adjacent side surfaces, wherein an interior angle of intersection of adjacent side surfaces of the trench is substantially 135°.

3. The semiconductor apparatus according to claim 1, wherein the first plane [100] and the second plane [110] define respective first and second areas, wherein the first area is larger than the second area.

4. The semiconductor apparatus according to claim 1, wherein the source region includes an electrode connecting area having four sides that are parallel with the first plane [100].

5. A semiconductor apparatus comprising:
   a semiconductor substrate of a first conductivity type;
   a base region of a second conductivity type formed on a principal surface of the semiconductor substrate;
   a trench having a substantially octagonal plane shape and formed in a periphery of the base region; and
   a source region of the first conductivity type formed on a surface of the base region along the trench, wherein
   principal planes on side surfaces of the trench are composed of: a first plane [100] that faces the base region through the source region and a second plane [110] that faces the base region through the source region,
   side surfaces of the trench whose principal planes are composed of the first plane [100] have a first side surface and a second side surface which is perpendicular to the first side surface, and
   if lengths of a first side and a second side of the first side surface and the second side surface, respectively, in a horizontal direction with respect to the semiconductor substrate are W1 and W3, a length of a third side of the side surfaces of the trench whose principal planes are composed of the second plane [110] in the horizontal direction with respect to the semiconductor substrate is W2, a minimum distance between the second side surface and an opposing second side surface is d, lengths of a fourth side and a fifth side of the base region that are parallel with the first side and the second side, respectively, are Da and Db, an intersection between a perpendicular bisector of the first side and a perpendicular bisector of the second side substantially corresponds to an intersection between a perpendicular bisector of the fourth side and a perpendicular bisector of the fifth side, and following expressions are satisfied:

$D_b \geq D_a$ $W3 \geq W1 > W2$ $W1 = d - \sqrt{2} \cdot W2$ $W2 > (\sqrt{2} - 1) \cdot (d - D_a)$.

6. The semiconductor apparatus according to claim 5, wherein a planar surface of the source region has a closed shape defined by adjacent side surfaces, wherein an interior angle of intersection of adjacent side surfaces of the trench is substantially 135°.

7. The semiconductor apparatus according to claim 5, wherein the lengths W1, W3, Da, Db satisfy a following expression:

$D_b - D_a = W3 - W1 \geq 0$.

8. The semiconductor apparatus according to claim 5, wherein the source region includes an electrode connecting area having four sides that are parallel with the first plane [100].

9. A method of manufacturing a semiconductor apparatus comprising:
   forming, on a principal surface of a semiconductor substrate of a first conductivity type, a first semiconductor layer with lower impurity concentration than the semiconductor substrate;
   forming a trench in the first semiconductor layer so that principal planes of side surfaces of the trench are composed of: a first plane [100] and a second plane [110];
   forming an oxide film by thermally oxidizing an inner surface of the trench;
   forming a gate electrode inside the trench with at least the oxide film interposed therebetween;
   forming a base region of a second conductivity type on the first semiconductor layer surrounded by the trench; and
   forming a source region of the first conductivity type on the base region along the side surface of the trench, wherein
   the first plane [100] and the second plane [110] face the base region through the source region, and
   a minimum distance between the base region and the second plane [110] is shorter than a minimum distance between the base region and the first plane [100].

10. The method according to claim 9, wherein:
    the side surfaces of the trench whose principal planes are composed of the first plane [100] have a first side surface and a second side surface which is perpendicular to the first side surface, and if lengths of a first side and a second side of the first side surface and the second side surface, respectively, in a horizontal direction with respect to the semiconductor substrate are W1 and W3, a length of a third side of the side surfaces of the trench whose principal planes are composed of the second plane [110] in the horizontal direction with respect to the semiconductor substrate is W2, a minimum distance between the second side surface and an opposing second side surface is d, lengths of a fourth side and a fifth side of the base region that are parallel with the first side and the second side, respectively, are Da and Db, an intersection between a perpendicular bisector of the first side and a perpendicular bisector of the second side substantially corresponds to an intersection between a perpendicular bisector of the fourth side and a perpendicular bisector of the fifth side, and following expressions are satisfied:

$D_b \geq D_a$ $W3 \geq W1 > W2$ $W1 = d - \sqrt{2} \cdot W2$ $W2 > (\sqrt{2}-1) \cdot (d-D_a)$.

11. The method according to claim 10, wherein the lengths W1, W3, Da, Db satisfy a following expression:

$D_b - D_a = W3 - W1 \geq 0$.

12. The method according to claim 9, wherein a planar surface of the source region has a closed shape defined by adjacent side surfaces, wherein an interior angle of intersection of adjacent side surfaces of the trench is substantially 135°.

13. The method according to claim 9, wherein the source region includes an electrode connecting area having four sides that are parallel with the first plane [100].

14. The method according to claim 9, wherein the source region has an annular shape that surrounds the base region.

15. The method according to claim 9, further comprising forming a source electrode on the source region to form a transistor device, wherein the transistor device is configured so that a distance that a dielectric current passes through the base region is shorter than if the minimum distance between the base region and the second plane [110] were not shorter than a minimum distance between the base region and the first plane [100].

16. The semiconductor apparatus according to claim 1, wherein the source region has an annular shape that surrounds the base region.

17. The semiconductor apparatus according to claim 1, wherein the semiconductor apparatus comprises a transistor configured so that a distance that a dielectric current passes through the base region is shorter than if the minimum distance ($L_2$) between the base region and the second plane [110] were not shorter than a minimum distance ($L_1$) between the base region and the first plane [100].

18. The semiconductor apparatus according to claim 5, wherein the source region has an annular shape that surrounds the base region.

19. The semiconductor apparatus according to claim 5, wherein the semiconductor apparatus comprises a transistor configured so that a distance that a dielectric current passes through the base region is shorter than if the expressions $D_b \geq D_a$ $W3 \geq W1 > W2$ $W1 = d - \sqrt{2} \cdot W2$ $W2 > (\sqrt{2}-1) \cdot (d-D_a)$ were not satisfied.

* * * * *